(12) United States Patent
Myasishchev et al.

(10) Patent No.: US 12,362,340 B2
(45) Date of Patent: Jul. 15, 2025

(54) LASER ABLATION-BASED SURFACE PROPERTY MODIFICATION AND CONTAMINATION REMOVAL

(71) Applicant: Intel Corporation, Santa Clara, CA (US)

(72) Inventors: Denis Myasishchev, Chandler, AZ (US); Andrew V. Mazur, Tempe, AZ (US); Purushotham Kaushik Muthur Srinath, Chandler, AZ (US); Robert M. Nickerson, Chandler, AZ (US); Shripad Gokhale, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 1048 days.

(21) Appl. No.: 16/557,771

(22) Filed: Aug. 30, 2019

(65) Prior Publication Data

US 2021/0066273 A1  Mar. 4, 2021

(51) Int. Cl.
*H01L 25/18* (2023.01)
*H01L 23/31* (2006.01)
*H01L 25/065* (2023.01)

(52) U.S. Cl.
CPC .......... *H01L 25/18* (2013.01); *H01L 23/3121* (2013.01); *H01L 23/3135* (2013.01); *H01L 23/3142* (2013.01); *H01L 23/315* (2013.01); *H01L 25/0657* (2013.01); *H01L 2225/0651* (2013.01); *H01L 2225/06562* (2013.01); *H01L 2225/06582* (2013.01); *H01L 2225/06589* (2013.01)

(58) Field of Classification Search
CPC .............. H01L 23/315; H01L 23/3135; H01L 23/3142; H01L 25/0657; H01L 25/043; H01L 25/074; H01L 25/0756; H01L 25/117; H01L 2224/08145; H01L 23/367; H01L 2023/4037; H01L 2023/4062
See application file for complete search history.

(56) References Cited

U.S. PATENT DOCUMENTS

| | | | | |
|---|---|---|---|---|
| 9,313,904 B2 * | 4/2016 | Kaneko | ................. | H05K 3/465 |
| 2008/0211079 A1 * | 9/2008 | Onodera | ............ | H10H 20/8586 |
| | | | | 257/E23.101 |
| 2009/0149034 A1 * | 6/2009 | Usui | .................. | H01L 23/3142 |
| | | | | 257/E21.328 |
| 2009/0230175 A1 * | 9/2009 | Kawashiro | ........... | B23K 1/0016 |
| | | | | 148/23 |
| 2011/0133333 A1 * | 6/2011 | Kwon | .................. | H01L 23/481 |
| | | | | 257/E21.585 |

(Continued)

OTHER PUBLICATIONS

Office Action from U.S. Appl. No. 18/399,178 mailed Sep. 10, 2024, 26 pgs.

*Primary Examiner* — Wael M Fahmy
*Assistant Examiner* — Quinton A Brasfield
(74) *Attorney, Agent, or Firm* — Schwabe, Williamson & Wyatt, P.C.

(57) ABSTRACT

Embodiments disclosed herein include electronic packages. In an embodiment, the electronic package comprises a mold layer and a die embedded in the mold layer. In an embodiment the electronic package further comprises a solder resist with a first surface over the mold layer and a second surface opposite from the first surface. In an embodiment, the second surface comprises a first cavity into the solder resist.

24 Claims, 7 Drawing Sheets

(56) References Cited

U.S. PATENT DOCUMENTS

| | | | |
|---|---|---|---|
| 2011/0156238 A1* | 6/2011 | Hsu | H01L 23/498 |
| | | | 257/692 |
| 2014/0374902 A1 | 12/2014 | Lee | |
| 2016/0334845 A1* | 11/2016 | Mittal | G05D 23/1906 |
| 2018/0033771 A1* | 2/2018 | Yu | H01L 25/50 |
| 2018/0061816 A1* | 3/2018 | Kim | H01L 23/3675 |
| 2019/0103385 A1* | 4/2019 | Karhade | H01L 25/105 |
| 2021/0043612 A1* | 2/2021 | Lee | H01L 23/3736 |

* cited by examiner

LASER ABLATION-BASED SURFACE PROPERTY MODIFICATION AND CONTAMINATION REMOVAL

TECHNICAL FIELD

Embodiments of the present disclosure relate to semiconductor devices, and more particularly to surface property modification of solder resist layers to improve package performance.

BACKGROUND

Thermal performance is a critical concern in many advanced packaging architectures. In particular, package-on-package (PoP) architectures require careful consideration of thermal performance since the underlying package (e.g., a system-on-chip (SoC) package) is entirely covered by the top package (e.g., a memory package). Accordingly, the path for thermal dissipation from the SoC is up through the memory package. In order to reduce the thermal resistance, an air gap between the two packages may be filled by a thermal adhesive layer.

It has been found that the thermal adhesive layer has poor adhesion to the top package. Particularly, surface contaminants on a solder resist layer significantly reduce the surface energy of the solder resist. This provides poor wetting, and ultimately leads to significant assembly issues including delamination and voiding. The surface contaminants (e.g., PDMS) are typically the result of upstream assembly of the top package, and it has proven difficult to eliminate the contaminants. Accordingly, solutions to remove the contaminants have been suggested. For example, solvent-based wet etching and fluorinated plasma etching approaches have been proposed to remove contaminants from the solder resist surface. However, both etching processes are global in nature and leave etchant residues which required further cleaning and/or showed other undesirable effects such as solder resist and buildup film swelling.

EMBODIMENTS OF THE PRESENT DISCLOSURE

Described herein are electronic packages with surface property modification of solder resist layers to improve package performance, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, thermal adhesive material between a bottom package and a top package in package-on-package (PoP) architectures has exhibited poor adhesion. Particularly, surface contaminants (e.g., PDMS) on the solder resist of the top package reduce the surface energy and result in manufacturing issues such as delamination and voiding. Accordingly, embodiments disclosed herein include treatments to the top package that eliminate the presence of contaminants on the solder resist.

In an embodiment, the contaminants are removed with a laser ablation process. The use of laser ablation provides advantages over the etching processes described above. For example, a laser ablation process may be a localized process. That is, laser ablation may be implemented at locations where the thermal adhesive will be present instead of across the entire solder resist layer, as is the case with the etching processes disclosed above. In an embodiment, the laser ablation process also does not produce residues that require further cleaning.

Another advantage of embodiments disclosed herein is that the laser ablation process may be used to reduce the thickness of the solder resist layer. This is particularly beneficial because the solder resist layer typically has a high thermal resistance. Furthermore, simply reducing the thickness of the solder resist during application of the solder resist is not possible due to manufacturing concerns. For example, solder resist layers are generally approximately 20 µm or greater. Accordingly, the solder resist layer serves as a thermal barrier. By reducing the thickness of the solder resist layer with a laser ablation process, the thermal performance of the package is improved. Additionally, selectively ablating the solder resist layer allows for hot spot locations to be mitigated through additional solder resist removal.

In some embodiments, the laser ablation may include the formation of a first cavity that extends into the solder resist layer. The first cavity may have a depth that is sufficient to remove the contaminants on the surface. For example, the first cavity may have a depth that is approximately 5 µm or less. In other embodiments, the first cavity may extend substantially through the thickness of the solder resist layer. For example, the first cavity may have a depth that is between approximately 10 µm and 20 µm. Deeper cavities such as these may allow for improved thermal performance, as described above. In yet another embodiment, a first cavity may be formed and one or more second cavities within the first cavity may be formed. The first cavity may be used to remove the surface contaminants, and the second cavities may be positioned over hot spots of the electronic package in order to improve thermal performance.

Figure 1A:
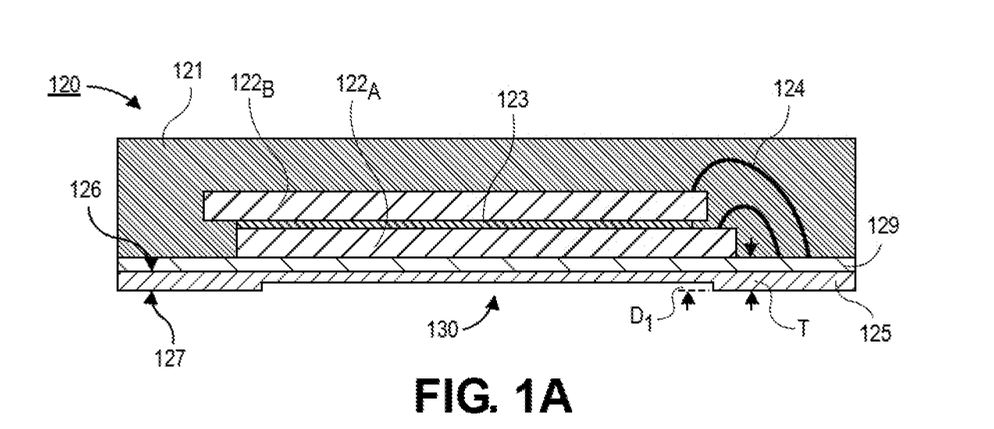
FIG. 1A is a cross-sectional illustration of a top package of a package-on-package (PoP) architecture with a solder resist layer that includes a cavity, in accordance with an embodiment.
Figure 1B:
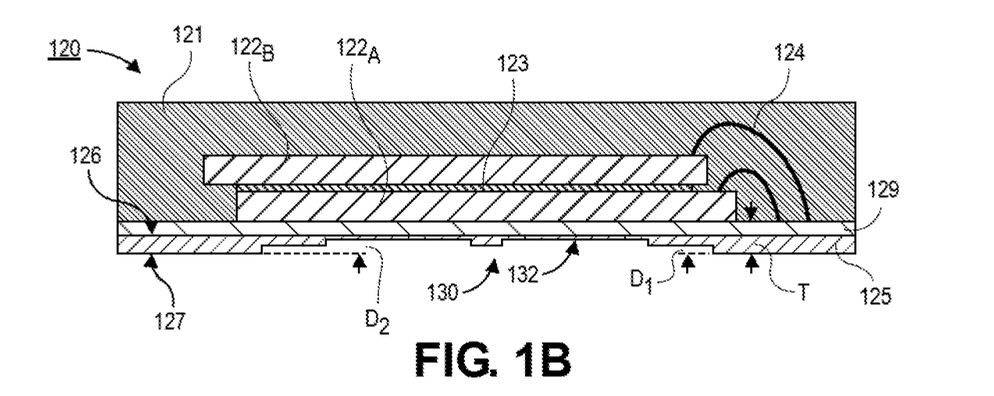
FIG. 1B is a cross-sectional illustration of a top package of a PoP architecture with a solder resist layer that includes a first cavity and a plurality of second cavities, in accordance with an embodiment.
Figure 1C:
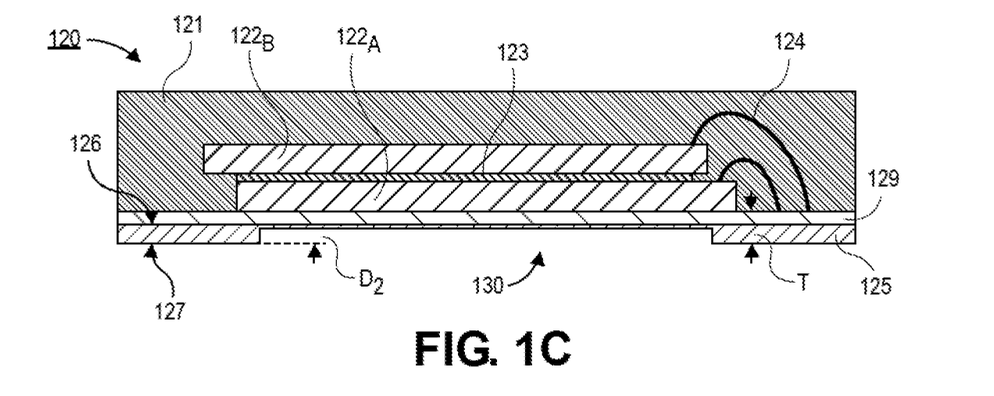
FIG. 1C is a cross-sectional illustration of a top package of a PoP architecture with a solder resist layer that includes a deep first cavity, in accordance with an embodiment.

Referring now to FIGS. 1A-1C, cross-sectional illustrations of various electronic packages 120 are shown, in accordance with an embodiment. In an embodiment, the electronic packages 120 in the FIGS. 1A-1C may be substantially similar to each other, with the exception that the solder resist layer 125 have different architectures.

Referring now to FIG. 1A, a cross-sectional illustration of an electronic package 120 is shown, in accordance with an embodiment. In a particular embodiment, the electronic package 120 is a top package of a PoP architecture. That is, the electronic package 120 may be configured to be disposed over an underlying package (not shown). In an embodiment, the electronic package 120 may comprise one or more dies 122. For example, a first die $122_A$ and a second die $122_B$ are shown as being stacked over each other. In some embodiments, a die attach film (DAF) 123 may be used to secure the first die $122_A$ to the second die $122_B$. The stacked dies 122 may be stacked offset from each other to allow for wire bonds 124 to be made down to conductive pads (now shown) on the solder resist layer 125. In an embodiment, the stacked dies 122 may be disposed over a package substrate 129 (e.g., organic build-up layers or the like). In an embodiment, the stacked dies 122 may be embedded in a mold layer 121.

In an embodiment, a solder resist layer 125 may be disposed over a surface of the package substrate 129. For example, a first surface 126 of the solder resist layer 125 may be in contact with the package substrate 129. In an embodiment, the solder resist layer 125 may have a thickness T. For example, the thickness T may be approximately 15 µm or greater, or approximately 20 µm or greater. In an embodiment, the solder resist layer 125 may also have a second surface 127 that is opposite from the first surface 126. The second surface 127 may include surface contaminants (not visible in FIG. 1A). For example, the surface contaminants may include PDMS or the like. The presence of surface contaminants results in a reduction in surface energy. This provides poor wetting of a thermal adhesive and can ultimately cause manufacturing defects such as delamination and/or voiding. The surface contaminants may be the result of upstream processing during assembly and/or handling of the electronic package 120.

As noted above, the removal of the surface contaminants from the second surface 127 of the electronic package 120 is critical to providing a high yield assembly process. Accordingly, embodiments include the formation of a cavity 130 into the second surface 127. In an embodiment, the cavity 130 may have a first depth $D_1$ (measured from the second surface 127 to a bottom of the cavity 130) that is sufficient to remove the surface contaminants. That is the first depth $D_1$ may only remove a small portion of the solder resist layer 125 proximate to the second surface 127. For example, the first depth $D_1$ may be approximately 10% of the thickness T or less, or approximately 5% of the thickness T or less. In a particular embodiment, the first depth $D_1$ may be approximately 5 µm or less, or approximately 3 µm or less.

In an embodiment, the cavity 130 does not occupy the entire second surface 127 of the solder resist layer 125. That is, the second surface 127 is not entirely removed. Accordingly, in some embodiments, there may be portions of the solder resist layer 125 that still include surface contaminants. For example, the remaining portions of the second surface 127 may still have surface contaminants, and the exposed portions of the solder resist layer 125 within the cavity 130 may be free from the surface contaminants.

In an embodiment, the cavity 130 has a shape and size that provides a desired area suitable for adhesion to an underlying package (not shown). That is, the cavity 130 has dimensions that are suitable for providing sufficient surface area onto which a thermal adhesive may be dispensed. In the illustrated embodiment, the cavity 130 has a width that is less than the width of the overlying dies 122. However, it is to be appreciated that the cavity 130 may also have a width that is greater than a width of the overlying dies 122 in some embodiments. Furthermore, while the cavity 130 is shown as being entirely within a footprint of the first die $122_A$, it is to be appreciated that the cavity 130 may also extend beyond a footprint of the first die $122_A$. Furthermore, while a single cavity 130 is shown, it is to be appreciated that any number of cavities 130 may be arranged across the second surface 127 of the solder resist layer 125.

Referring now to FIG. 1B, a cross-sectional illustration of an electronic package 120 is shown, in accordance with an additional embodiment. In an embodiment, the electronic package 120 in FIG. 1B is substantially similar to the electronic package 120 in FIG. 1A, with the exception that a plurality of second cavities 132 are disposed within the first cavity 130. In an embodiment, the second cavities 132 may have a second depth $D_2$ (measured from the second surface 127 to the bottom of the second cavity 132) that is greater than the first depth $D_1$. In an embodiment, the second depth $D_2$ may be approximately 75% of the thickness T or more, or approximately 95% of the thickness T or more. In a particular embodiment, the second depth $D_2$ may be chosen so that only approximate 5 µm or less, or approximately 1 µm or less of the solder resist layer 125 remains between the bottom of the second cavity 132 and the first surface 126.

In an embodiment, the second depth $D_2$ is less than the thickness T. This ensures that the second cavity 132 does not pass all the way through the solder resist layer 125. Keeping the second cavity 132 from passing all the way through the solder resist layer 125 is important because the bottom surface of the package substrate 129 cannot be exposed.

That is, copper or other materials of the package substrate 129 over the first surface 126 remain covered by at least a portion of the solder resist layer 125.

In an embodiment, the inclusion of one or more second cavities 132 provides improved thermal performance to the electronic package 120. Since the solder resist layer 125 has a high thermal resistance (e.g., in some embodiments, the solder resist layer 125 has the highest thermal resistance of the electronic package 120), removing significant portions of the solder resist layer 125 reduces the thermal resistance of the electronic package 120. Accordingly, thermal energy from an underlying package (not shown) may more easily propagate up through the electronic package 120.

In the illustrated embodiment, two second cavities 132 are shown. However, it is to be appreciated that there may be any number of second cavities 132 (e.g., one or more). In an embodiment, the second cavities 132 are substantially centered within the first cavity 130. However, it is to be appreciated that the second cavities 132 may be located anywhere within the first cavity 130. For example, the second cavities 132 may be located in locations where hot spots are expected. This allows for improved thermal performance, since second cavities 132 allow for improved heat removal from the hot spots. In other embodiments, the second cavities 132 may also be outside of the first cavity 130.

Referring now to FIG. 1C, a cross-sectional illustration of an electronic package 120 is shown, in accordance with an embodiment. In an embodiment, the electronic package 120 in FIG. 1C may be substantially similar to the electronic package 120 in FIG. 1A, with the exception that the cavities 130 includes a second depth $D_2$ that is greater than the first depth $D_1$ in FIG. 1A. In an embodiment, the second depth $D_2$ may be approximately 75% of the thickness T or more, or approximately 95% of the thickness T or more. In a particular embodiment, the second depth $D_2$ may be chosen so that only approximate 5 µm or less, or approximately 1 µm or less of the solder resist layer 125 remains between the bottom of the cavity 130 and the first surface 126.

In an embodiment, the second depth $D_2$ is less than the thickness T. This ensures that the cavity 130 does not pass all the way through the solder resist layer 125. Keeping the cavity 130 from passing all the way through the solder resist layer 125 is important because the bottom surface of the package substrate 129 cannot be exposed. That is, copper or other materials of the package substrate over the first surface 126 remain covered by at least a portion of the solder resist layer 125.

Figure 2A:
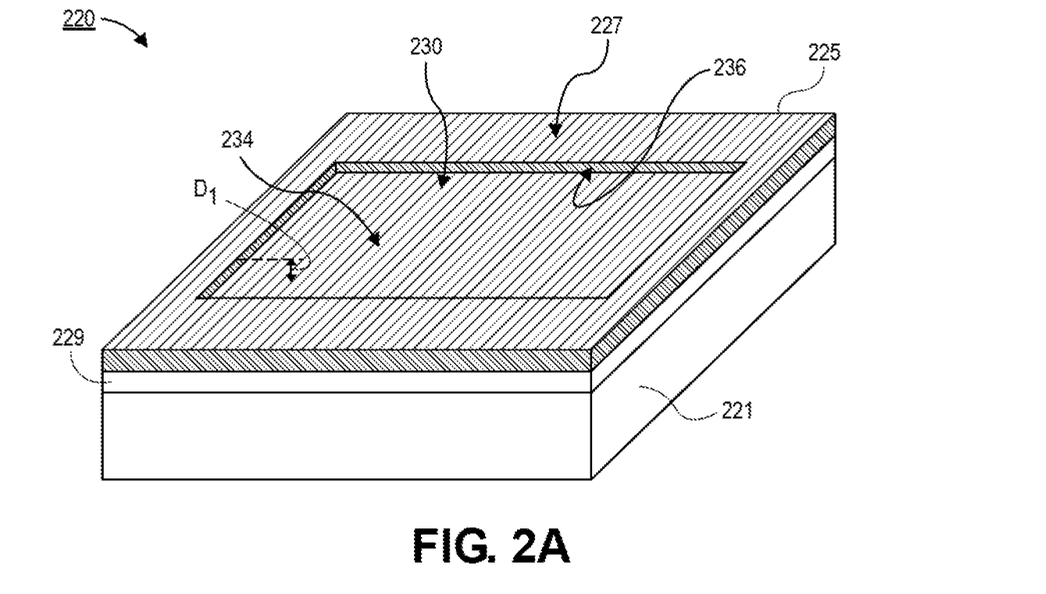
FIG. 2A is a perspective view illustration of an electronic package that illustrates a solder resist layer with a cavity, in accordance with an embodiment.

Referring now to FIG. 2A, a perspective view illustration of an electronic package 220 is shown, in accordance with an embodiment. In the illustrated embodiment, the one or more dies are hidden from view by the mold layer 221. As shown, a solder resist layer 225 is over a surface of the package substrate 229 that is disposed over the surface of the mold layer 221. A cavity 230 may be formed into the solder resist layer 225. The cavity 230 may have a bottom surface 234 and sidewall surfaces 236. In the illustrated embodiment, the sidewall surfaces 236 are shown as being substantially vertical. However, it is to be appreciated that the sidewall surfaces 236 may have a tapered profile, as will be described in greater detail below.

In an embodiment, the cavity 230 extends a first depth $D_1$ into the surface 227 of the solder resist layer 225. That is, a bottom surface 234 of the cavity 230 may be spaced away (in the Z-direction) from the exposed surface 227 of the solder resist layer 225 by the first depth $D_1$. In an embodiment, the first depth $D_1$ may be similar to the first depth $D_1$ in FIG. 1A. For example, the first depth $D_1$ may be approximately 10% of the thickness of the solder resist layer 225 or less, or approximately 5% of the of the solder resist layer 225 or less. In a particular embodiment, the first depth $D_1$ may be approximately 5 µm or less, or approximately 3 µm or less. In other embodiments, the first depth $D_1$ may be similar to the second depth $D_2$ in FIG. 1C. For example, the first depth $D_1$ may be approximately 75% of the thickness of the solder resist layer 225 or more, or approximately 95% of the thickness of the solder resist layer 225 or more. In a particular embodiment, the first depth $D_1$ may be chosen so that only approximate 5 µm or less, or approximately 1 µm or less of the solder resist layer 225 remains between the bottom of the cavity 230 and the surface of the mold layer 221.

Figure 2B:
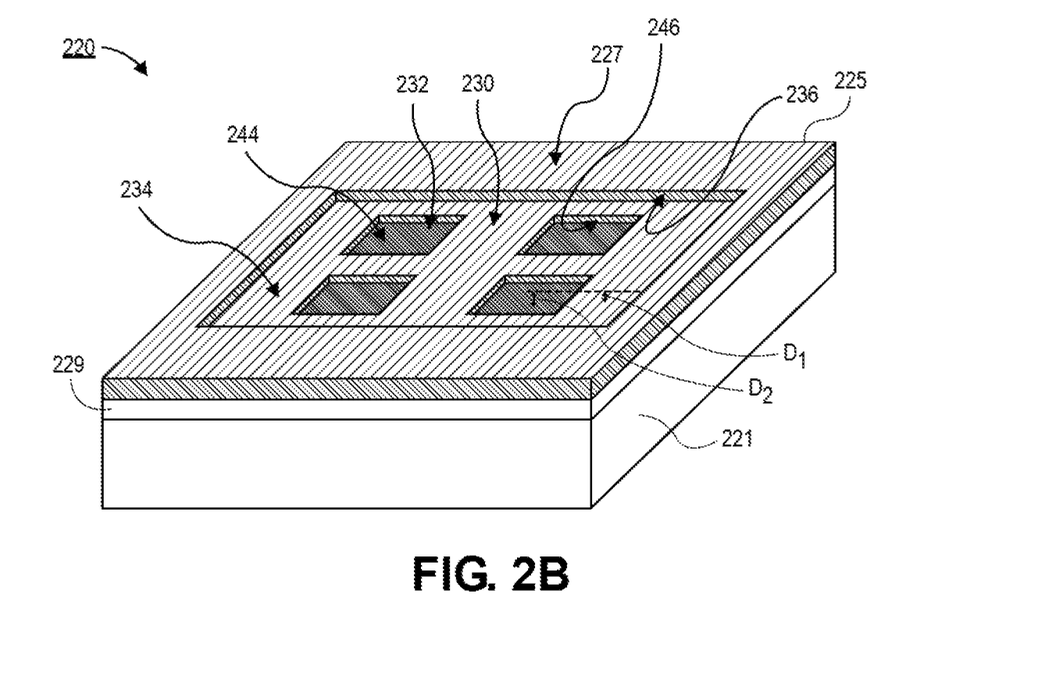
FIG. 2B is a perspective view illustration of an electronic package that illustrates a solder resist layer with a first cavity and a plurality of second cavities within the first cavity, in accordance with an embodiment.

Referring now to FIG. 2B, a perspective view illustration of an electronic package 220 with a first cavity 230 and a plurality of second cavities 232 is shown, in accordance with an embodiment. In an embodiment, the electronic package 220 may be substantially similar to the electronic package 220 in FIG. 2A, with the exception that the second cavities 232 are formed into the bottom surface 234 of the first cavity 230. For example, a set of four second cavities 232 are arranged across the bottom surface 234 of the first cavity 230. However, it is to be appreciated that any number of second cavities 232 may be disposed into the bottom surface 234 of the first cavity 230. In an embodiment, the second cavities 232 may include a bottom surface 244 and sidewall surfaces 246. The sidewall surfaces 246 are illustrated as being substantially vertical, but it is to be appreciated that in other embodiments the sidewall surfaces 246 may be tapered.

In an embodiment, the first cavity 230 may have a first depth $D_1$ and the second cavities 232 may have a second depth $D_2$. The first depth $D_1$ may be measured from the bottom surface 234 to the surface 227, and the second depth $D_2$ may be measured from the bottom surface 244 to the surface 227. In an embodiment, the first depth $D_1$ may be similar to the first depth $D_1$ in FIG. 1B. For example, the first depth $D_1$ may be approximately 10% of the thickness of the solder resist layer 225 or less, or approximately 5% of the of the solder resist layer 225 or less. In a particular embodiment, the first depth $D_1$ may be approximately 5 µm or less, or approximately 3 µm or less. In an embodiment, the second depth $D_2$ may be similar to the second depth $D_2$ in FIG. 1B. For example, the second depth $D_2$ may be approximately 75% of the thickness of the solder resist layer 225 or more, or approximately 95% of the thickness of the solder resist layer 225 or more. In a particular embodiment, the second depth $D_2$ may be chosen so that only approximate 5 µm or less, or approximately 1 µm or less of the solder resist layer 225 remains between the bottom of the cavity 230 and the surface of the mold layer 221.

In FIGS. 2A and 2B, the bottom surfaces 234, 244 of the cavities 230, 232 are shown as being smooth and the sidewall surfaces 236, 246 are shown as being substantially vertical. However, it is to be appreciated that electronic packages may include sidewalls and surfaces that are not perfectly flat, vertical, etc. Additionally, while the perimeters of the cavities 230, 232 are shown as being rectangular with linear edges, embodiments are not limited to such configurations.

Figure 3A:
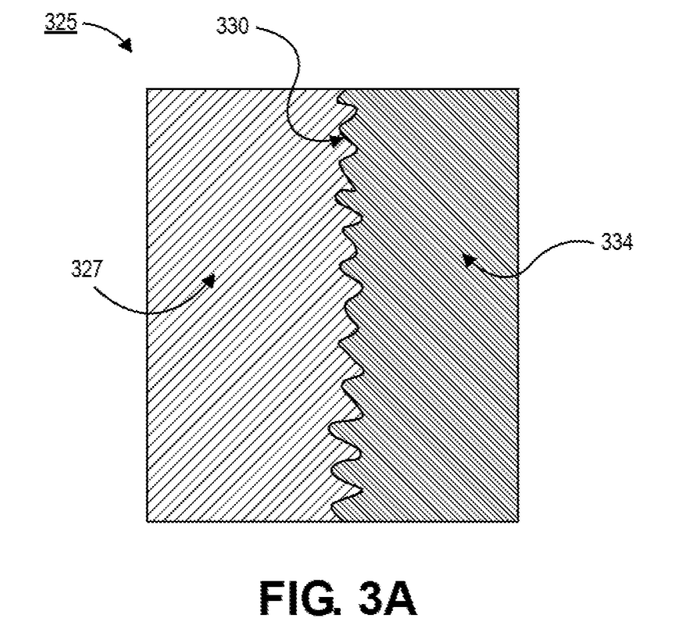
FIG. 3A is a zoomed in plan view illustration of an electronic package that illustrates an edge of a cavity into a solder resist layer, in accordance with an embodiment.
Figure 3B:
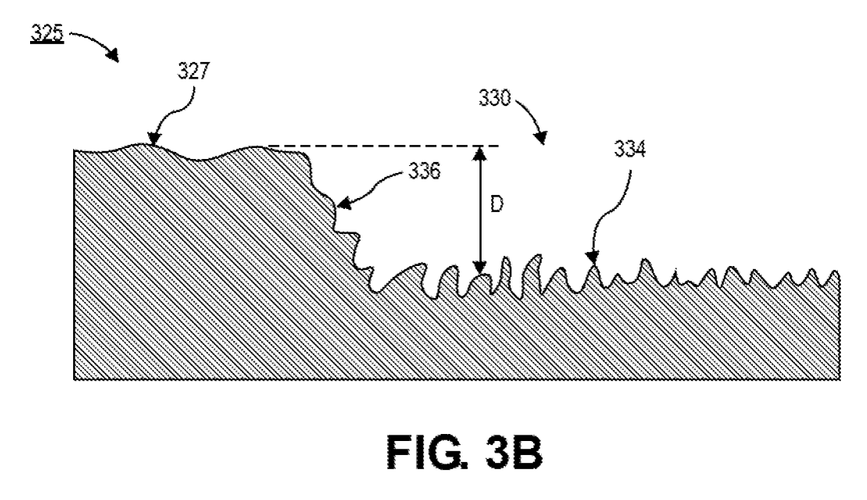
FIG. 3B is a cross-sectional illustration of a solder resist layer that illustrates the surface roughness differences of a solder resist within a cavity and outside the cavity, in accordance with an embodiment.

For example FIGS. 3A and 3B illustrate zoomed in illustrations of the topography of the solder resist layer 325 on an electronic package in accordance with an embodiment.

Referring now to FIG. 3A, a plan view illustration of a portion of the solder resist layer 325 is shown, in accordance with an embodiment. The portion of the solder resist layer 325 depicts a surface 327 of the solder resist layer 325 and a bottom surface 334 of a portion of a cavity 330. As shown, the cavity 330 does not have a linear edge. Particularly, the cavity 330 may have a jagged edge. In some embodiments the edge of the cavity 330 may be referred to as a scalloped edge.

The shape of the perimeter of the cavity 330 is the result of the processing used to form the cavity 330. Particularly, when the cavity 330 is formed by a laser ablation process, the laser beam may not provide a perfectly linear edge depending on the settings of the laser. For example, in order to increase the throughput, the speed and spot size of the laser may be increased. This may result in the scalloping of the perimeter of the cavity, similar to what is shown in FIG. 3A. However, it is to be appreciated that laser ablation processing may also be able to provide substantially linear edges without scalloping, and such embodiments are also included herein.

Referring now to FIG. 3B, a cross-sectional illustration of the solder resist layer 325 is shown, in accordance with an embodiment. As shown, the surface 327 of the solder resist layer 325 may have a first surface roughness and the bottom surface 334 of the cavity 330 may have a second surface roughness. For example, the second surface roughness of the bottom surface of the cavity 330 is greater than the first surface roughness of the surface 327. The increased surface roughness may be attributable to the laser ablation used to form the cavity 330.

The increased surface roughness of the bottom surface 334 of the cavity 330 may provide improved adhesion. That is, the increased surface roughness provides more surface area to which the thermal adhesive may bond. Accordingly, voiding and delamination is further reduced. In some embodiments, the difference in the surface roughness between the bottom surface 334 of the cavity 330 and the surface 327 may also result in optical differences to the solder resist layer 325. For example, the bottom surface 334 of the cavity 330 may be optically darker than the surface 327 due to the surface roughness of the bottom surface 334 diffracting more light.

Due to the bottom surface 334 having a relatively high surface roughness, it is to be appreciated that the depth D of the cavity may not be uniform at all locations across the cavity 330. Accordingly, it is to be appreciated that the depths D (e.g., $D_1$, $D_2$, etc.) referred to herein may represent an average depth of the various cavities.

FIG. 3B also illustrates that the sidewall surface 336 need not be perfectly vertical. For example, the sidewall surface 336 may have a substantially tapered profile. In an embodiment, a surface roughness of the sidewall surface 336 may be greater than the surface roughness of the surface 327. In some embodiments, the surface roughness of the sidewall surface 336 may be similar to the surface roughness of the bottom surface 334.

Figure 4A:
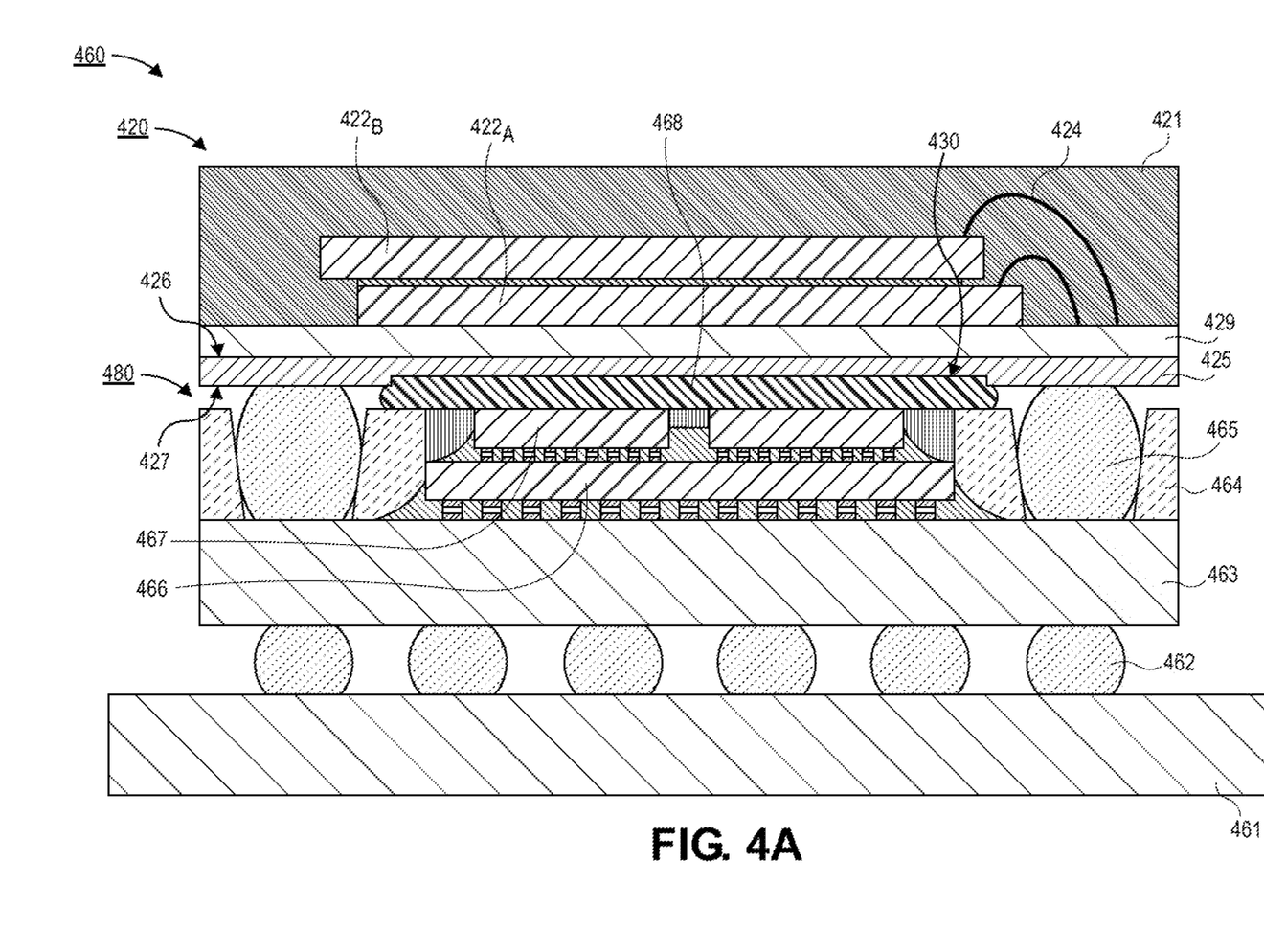
FIG. 4A is a cross-sectional illustration of an electronic system that includes a PoP architecture with a thermal adhesive between a top package and a bottom package, where the solder resist layer of the top package has a cavity, in accordance with an embodiment.
Figure 4B:
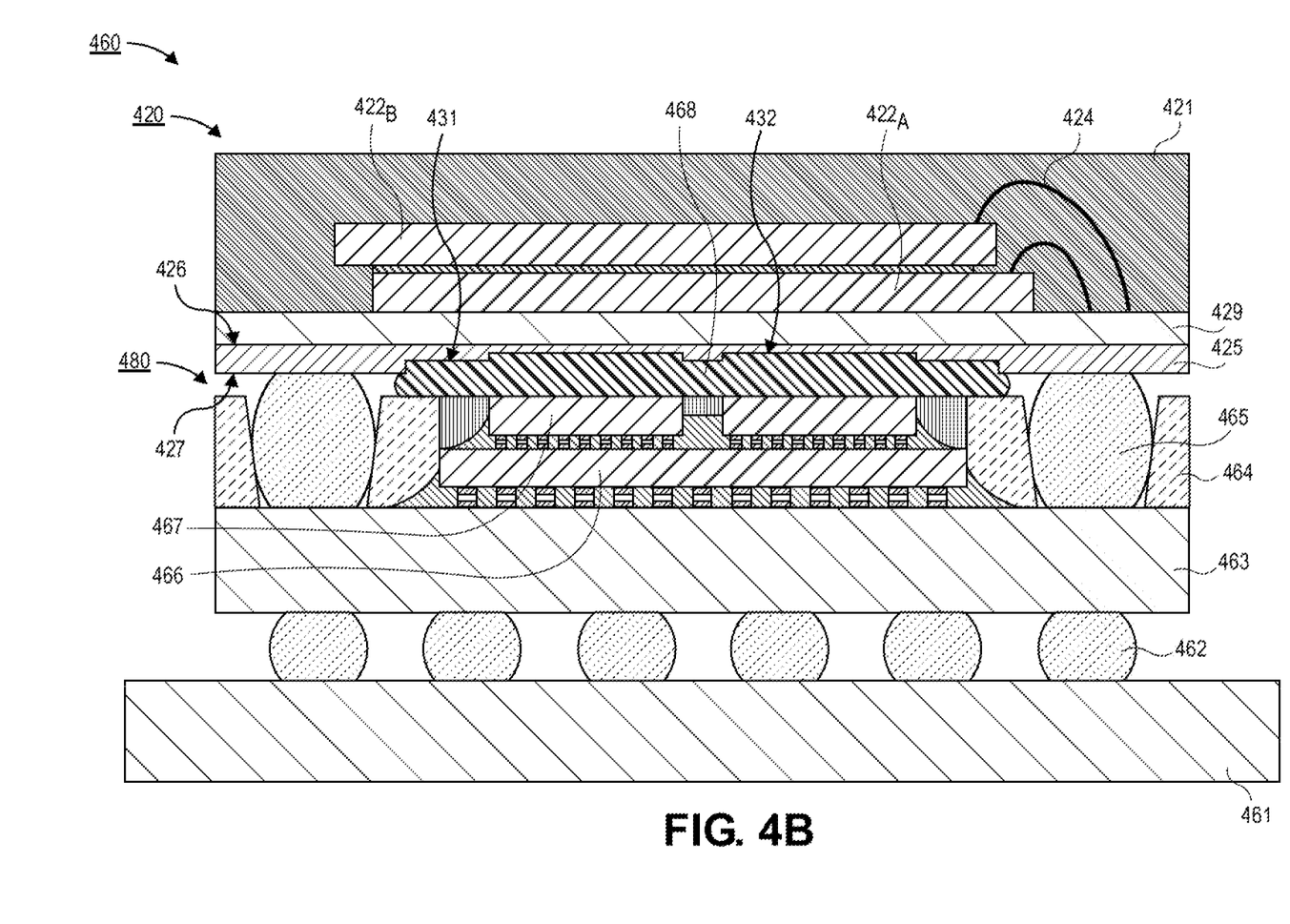
FIG. 4B is a cross-sectional illustration of an electronic system that includes a PoP architecture with a thermal adhesive between a top package and a bottom package, where the solder resist layer of the top package has a first cavity and a plurality of second cavities within the first cavity, in accordance with an embodiment.
Figure 4C:
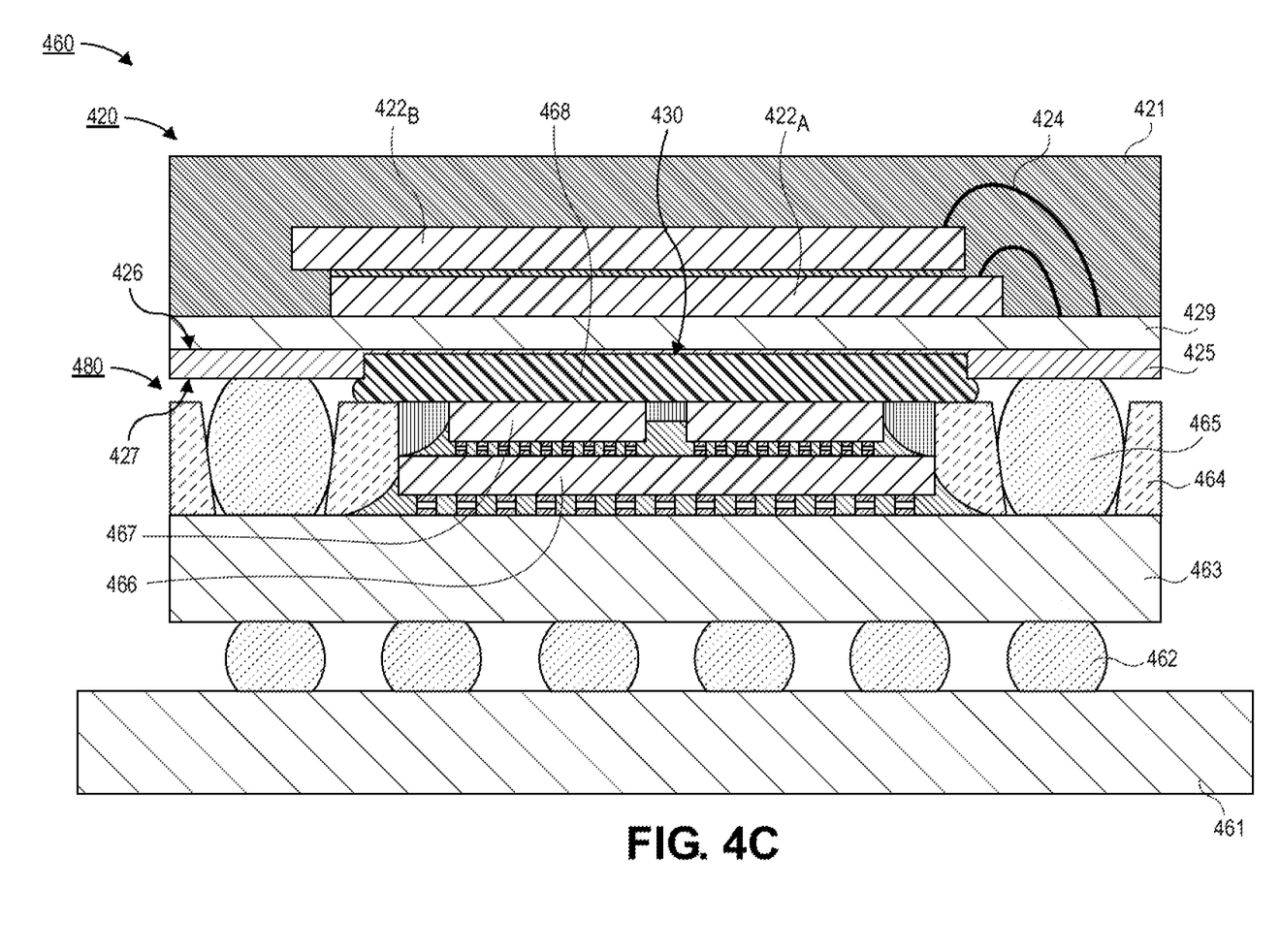
FIG. 4C is a cross-sectional illustration of an electronic system that includes a PoP architecture with a thermal adhesive between a top package and a bottom package, where the solder resist layer of the top package has a cavity that extends nearly all the way through the solder resist layer, in accordance with an embodiment.

Referring now to FIGS. 4A-4C, cross-sectional illustrations of electronic systems 460 are shown, in accordance with various embodiments. In an embodiment, the electronic systems 460 in FIGS. 4A-4C are substantially similar to each other with the exception of having different cavity configurations in the solder resist layer 425 of the second (top) package 420.

Referring now to FIG. 4A, a cross-sectional illustration of an electronic system 460 is shown, in accordance with an embodiment. In an embodiment, the electronic system 460 includes a board 461. The board 461 may be a printed circuit board (PCB) or the like. In an embodiment a first package 480 may be electrically coupled to the board 461 by interconnects 462. The interconnects 462 are shown as solder bumps, but it is to be appreciated that any interconnect architecture may be used to connect the first package 480 to the board 461.

In an embodiment, the first package 480 may comprise a package substrate 463. The package substrate 463 may comprise conductive traces, vias, pads, etc. (not shown) that are embedded in one or more dielectric layers. In some embodiments the package substrate 463 may comprise a core or the package substrate 463 may be coreless. In an embodiment, one or more dies may be electrically coupled to the package substrate 463. For example a first die 466 is directly attached to the package substrate 463. One or more second dies 467 may be coupled to the first die 466. In an embodiment, the first die 466 may be include transistors fabricated at a first process node and the second dies 467 may include transistors fabricated at a second process node that is more advanced than the first process node. In an embodiment, the first package 480 may also comprise one or more mold layers 464. The mold layers 464 may embed the dies 467, 466. In some embodiments, through mold interconnects (TMIs) 465 may pass through the mold layer 464. In an embodiment, the first package 480 may be a system on a chip (SoC), or any other multi-chip package architecture.

In an embodiment, the electronic system 460 may further comprise a second package 420. The second package 420 may be electrically coupled to the first package 480 by the TMIs 465. For example, wire bonds 424 may provide electrical coupling between dies $422_A$ and $422_B$ and the TMIs 465. Accordingly, the dies 422 of the second package 420 may be electrically coupled to the dies 466, 467 of the first package 480. In an embodiment, the dies 422 may be memory dies. In an embodiment, the dies 422 may be embedded in a mold layer 421.

In an embodiment, a solder resist layer 425 may be disposed over a package substrate 429, and the package substrate 429 may be in contact with the mold layer 421 of the second package 420. For example, a first surface 426 of the solder resist layer 425 may contact the package substrate 429, and a second surface 427 of the solder resist layer 425 may face towards the first package 480. In an embodiment, a cavity 430 may be disposed into the second surface 427 of the solder resist layer 425. In an embodiment, a footprint of the cavity 430 may cover a footprint of the die 466. The cavity 430 may be substantially similar to the cavity 130 described above with respect to FIG. 1A.

In an embodiment, a thermal adhesive 468 may fill the space between the first package 480 and the second package 420. In an embodiment, the thermal adhesive may be a thermally conductive epoxy, polymer, or the like. The thermal adhesive 468 may substantially fill the cavity 430 of the solder resist layer 425. Particularly, it is noted that the formation of the cavity 430 removes surface contaminants from the portions of the solder resist layer 425 that interfaces with the thermal adhesive 468. As such, the surface energy is increased and the adhesion is improved. This results in a decrease in delamination and voiding. The formation of the cavity 430 may also locally increase the surface roughness of the solder resist layer 425 to further enhance the adhesion.

Referring now to FIG. 4B, a cross-sectional illustration of an electronic system 460 is shown, in accordance with an additional embodiment. In an embodiment, the electronic system 460 is substantially similar to the electronic system 460 in FIG. 4A, with the exception that a plurality of second cavities 432 are disposed in the solder resist layer 425 within the first cavity 430. As noted above the inclusion of second cavities 432 results in localized decreases in the thickness of the solder resist layer 425. Accordingly, the thermal performance may be improved.

In some embodiments, the second cavities 432 may be located over the dies 467. That is, the footprint of each of the second cavities 432 covers a footprint of one of the dies 467. Accordingly, the extra heat produced by the stacked dies 467 may be more easily dissipated. In some embodiments, the second cavities 432 do not entirely cover the footprint of one of the dies 467. In such embodiments, the second cavities 432 may be positioned above hot-spots within the die 467. Hot-spots may refer to portions of the die that run at higher temperatures in some or all use conditions. For example, hot-spots may refer to locations of the die 467 with a higher density of transistor devices than other regions of the die 467. In an embodiment, the first cavity 430 and the second cavities 432 may be substantially similar to the first cavity 130 and the second cavities 132 in FIG. 1B.

Referring now to FIG. 4C, a cross-sectional illustration of an electronic system 460 is shown, in accordance with an additional embodiment. The electronic system 460 may be substantially similar to the electronic system 460 in FIG. 4A, with the exception that the cavity 430 is deeper. For example, the cavity 430 may have a depth that substantially passes through a thickness of the solder resist layer 425 without passing all the way through the solder resist layer 425. Removing additional solder resist material improves the thermal performance of the electronic system 460. In an embodiment, the cavity 430 may be substantially similar to the cavity 130 in FIG. 1C.

Figure 5:
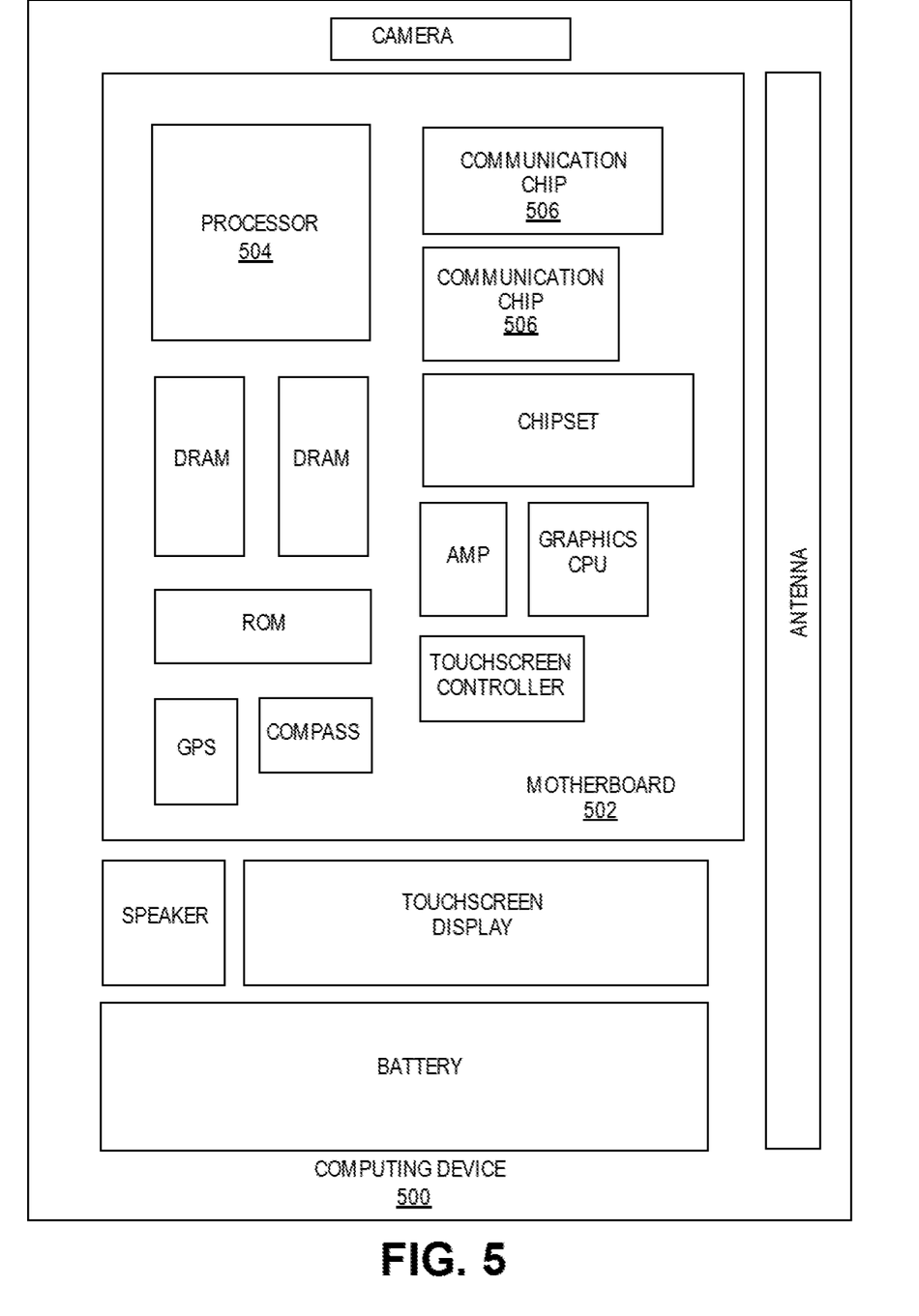
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor 504 may be part of an electronic package that comprises a thermal adhesive layer that fills a cavity in a solder resist layer, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip 506 may be part of an electronic package that comprises a thermal adhesive layer that fills a cavity in a solder resist layer, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a mold layer; a die embedded in the mold layer; and a solder resist with a first surface over the mold layer and a second surface opposite from the first surface, and wherein the second surface comprises a first cavity into the solder resist.

Example 2: the electronic package of Example 1, wherein a depth of the first cavity is less than a thickness of the solder resist.

Example 3: the electronic package of Example 1 or Example 2, wherein a bottom surface the first cavity has a first surface roughness and the second surface has a second surface roughness, and wherein the first surface roughness is greater than the second surface roughness.

Example 4: the electronic package of Examples 1-3, wherein a perimeter of the first cavity is a scalloped edge.

Example 5: the electronic package of Examples 1-4, further comprising a second cavity within the first cavity.

Example 6: the electronic package of Example 5, wherein the first cavity has a first depth and the second cavity has a second depth, and wherein the second depth is greater than the first depth.

Example 7: the electronic package of Example 5, further comprising a third cavity within the first cavity.

Example 8: the electronic package of Examples 1-7, wherein the second surface comprises a contaminant, and a third surface the solder resist within the first cavity is free of the contaminant.

Example 9: the electronic package of Example 8, wherein the contaminant is PDMS.

Example 10: the electronic package of Examples 1-9, wherein the die is a memory die.

Example 11: the electronic package of Example 10, further comprising: a plurality of memory dies over the first surface of the solder resist.

Example 12: the electronic package of Examples 1-11, wherein a sidewall surface of the first cavity is tapered.

Example 13: an electronic package, comprising: a first package, wherein the first package comprises: a package substrate; a first die over the package substrate; a second die over the first die; a mold layer over the package substrate and embedding the first die and the second die; and a through mold interconnect through the mold layer; a second package, wherein the second package comprises: a mold layer; a plurality of third dies embedded in the mold layer; and a solder resist on the mold layer, wherein a first surface of the solder resist that faces away from the mold layer comprises a first cavity into the solder resist; and a thermal adhesive between the first package and the second package.

Example 14: the electronic package of Example 13, wherein the thermal adhesive fills the first cavity.

Example 15: the electronic package of Example 13 or Example 14, wherein a footprint of the first cavity covers a footprint of the first die.

Example 16: the electronic package of Examples 13-15 further comprising a second cavity within the first cavity.

Example 17: the electronic package of Example 16, wherein a footprint of the second cavity covers a footprint of the second die.

Example 18: the electronic package of Example 16, wherein a footprint of the second cavity covers a portion of a footprint of the second die.

Example 19: the electronic package of Example 18, wherein the portion of the footprint of the second die that is covered by the footprint of the second cavity is a hotspot of the second die.

Example 20: the electronic package of Examples 13-19, wherein a depth of the first cavity is less than a thickness of the solder resist.

Example 21: the electronic package of Examples 13-20, wherein the first surface has a first surface roughness and a second surface the solder resist within the first cavity has a second surface roughness, and wherein the second surface roughness is greater than the first surface roughness.

Example 22: the electronic package of Examples 13-21, wherein the first package is a multi-chip processor package, and wherein the second package is a memory package.

Example 23: the electronic system, comprising: a board; a first package coupled to the board; a second package coupled to the first package, wherein the second package comprises a solder resist with a first cavity into a surface facing the first package; and a thermal adhesive between the first package and the second package, wherein the thermal adhesive fills the first cavity.

Example 24: the electronic system of Example 23, further comprising: a second cavity within the first cavity.

Example 25: the electronic system of Example 23, wherein a surface roughness of the solder resist within the first cavity is greater than a surface roughness of the solder resist outside of the first cavity.

What is claimed is:

1. An electronic package, comprising:
a mold layer;
a die embedded in the mold layer;
a solder resist with a first surface over the mold layer and a second surface opposite from the first surface, and wherein the second surface comprises a first cavity into the solder resist, the first cavity vertically overlapping with the die, wherein a depth of the first cavity is less than a thickness of the solder resist; and
a plurality of interconnects in contact with the second surface of the solder resist, wherein the plurality of interconnects is outside of the first cavity.

2. The electronic package of claim 1, wherein a bottom surface the first cavity has a first surface roughness and the second surface has a second surface roughness, and wherein the first surface roughness is greater than the second surface roughness.

3. The electronic package of claim 1, wherein a perimeter of the first cavity is a scalloped edge.

4. The electronic package of claim 1, further comprising a second cavity within the first cavity.

5. The electronic package of claim 4, wherein the first cavity has a first depth and the second cavity has a second depth, and wherein the second depth is greater than the first depth.

6. The electronic package of claim 4, further comprising a third cavity within the first cavity.

7. The electronic package of claim 1, wherein the second surface comprises a contaminant, and a third surface the solder resist within the first cavity is free of the contaminant.

8. The electronic package of claim 1, wherein the die is a memory die.

9. The electronic package of claim 8, further comprising:
a plurality of memory dies over the first surface of the solder resist.

10. The electronic package of claim 1, wherein a sidewall surface of the first cavity is tapered.

11. An electronic package, comprising:
a first package, wherein the first package comprises:
    a package substrate;
    a first die over the package substrate;
    a second die over the first die;
    a mold layer over the package substrate and embedding the first die and the second die; and
    a through mold interconnect through the mold layer;
a second package, wherein the second package comprises:
    a mold layer;
    a plurality of third dies embedded in the mold layer;
    a solder resist on the mold layer, wherein a first surface of the solder resist that faces away from the mold layer comprises a first cavity into the solder resist, the first cavity vertically overlapping with the plurality of third dies, wherein a depth of the first cavity is less than a thickness of the solder resist; and
    a plurality of interconnects in contact with the first surface of the solder resist, wherein the plurality of interconnects is outside of the first cavity; and
a thermal adhesive between the first package and the second package.

12. The electronic package of claim 11, wherein the thermal adhesive fills the first cavity.

13. The electronic package of claim 11, wherein a footprint of the first cavity covers a footprint of the first die.

14. The electronic package of claim 11 further comprising a second cavity within the first cavity.

15. The electronic package of claim 14, wherein a footprint of the second cavity covers a footprint of the second die.

16. The electronic package of claim 14, wherein a footprint of the second cavity covers a portion of a footprint of the second die.

17. The electronic package of claim 16, wherein the portion of the footprint of the second die that is covered by the footprint of the second cavity is a hotspot of the second die.

18. The electronic package of claim 11, wherein the first surface has a first surface roughness and a second surface the solder resist within the first cavity has a second surface roughness, and wherein the second surface roughness is greater than the first surface roughness.

19. The electronic package of claim 11, wherein the first package is a multi-chip processor package, and wherein the second package is a memory package.

20. An electronic system, comprising:
a board;
a first package coupled to the board;
a second package coupled to the first package, the second package comprising a die, wherein the second package comprises a solder resist with a first cavity into a surface facing the first package, the first cavity vertically overlapping with the die, wherein a depth of the first cavity is less than a thickness of the solder resist, and wherein the second package comprises a plurality of interconnects in contact with the surface of the solder resist, wherein the plurality of interconnects is outside of the first cavity; and
a thermal adhesive between the first package and the second package, wherein the thermal adhesive fills the first cavity.

21. The electronic system of claim 20, further comprising:
a second cavity within the first cavity.

22. The electronic system of claim 20, wherein a surface roughness of the solder resist within the first cavity is greater than a surface roughness of the solder resist outside of the first cavity.

23. An electronic package, comprising:
a mold layer;
a die embedded in the mold layer;
a solder resist with a first surface over the mold layer and a second surface opposite from the first surface, wherein the second surface comprises a first cavity into the solder resist, wherein a depth of the first cavity is less than a thickness of the solder resist, the first cavity vertically overlapping with the die, wherein a perimeter of the first cavity is a scalloped edge, and wherein the solder resist extends outside of a footprint of the die; and
a plurality of interconnects in contact with the second surface of the solder resist, wherein the plurality of interconnects is outside of the first cavity.

24. An electronic package, comprising:
a mold layer;
a die embedded in the mold layer;
a solder resist with a first surface over the mold layer and a second surface opposite from the first surface, wherein the second surface comprises a first cavity into the solder resist, wherein a depth of the first cavity is less than a thickness of the solder resist, the first cavity vertically overlapping with the die, wherein a sidewall surface of the first cavity is tapered, and wherein the solder resist extends outside of a footprint of the die; and
a plurality of interconnects in contact with the second surface of the solder resist, wherein the plurality of interconnects is outside of the first cavity.

* * * * *